US006229708B1

United States Patent
Corbin, Jr. et al.

(10) Patent No.: US 6,229,708 B1
(45) Date of Patent: May 8, 2001

(54) MULTI-AXIS MICROPROCESS OR DOCKING MECHANISM

(75) Inventors: John Saunders Corbin, Jr.; David Allen Hall, both of Austin; Kenneth Carl Larsen, Georgetown; Mark Wayne Mueller; Peter Matthew Thomsen, both of Austin, all of TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/276,336

(22) Filed: Mar. 25, 1999

(51) Int. Cl.[7] ........................................................ H05K 7/00
(52) U.S. Cl. ........................... 361/728; 361/725; 361/730; 361/752; 361/759; 439/260; 439/342
(58) Field of Search ....................................... 361/728–730, 361/752, 753; 439/310, 340–342, 259–261

(56) References Cited

U.S. PATENT DOCUMENTS 3,575,482 * 4/1971 MacMaster et al. .................. 317/101
4,236,190 * 11/1980 Hollingsead et al. ................ 361/391
4,259,931 * 4/1981 Clark et al. ............................ 123/198
5,010,426 * 4/1991 Krenz .................................. 360/97.01
5,967,824 * 10/1999 Neal et al. ............................ 439/342
6,128,196 * 10/2000 Hoyle, Jr. et al. .................... 361/752

* cited by examiner

*Primary Examiner*—Jayprakash N. Gandhi
*Assistant Examiner*—Tuan Dinh
(74) *Attorney, Agent, or Firm*—Felsman, Bradley, Vaden, Gunter & Dillon, LLP

(57) ABSTRACT

A mechanism has a subassembly that contains a microprocessor. The mechanism allows the microprocessor to be easily installed through frontal or rear access into a rack drawer and subsequently docked into a receiving assembly. The docking mechanism is multi-axis in that installation of the subassembly occurs along a single axis, but docking of the microprocessor occurs along an axis that is normal to the installation axis. Actuation of the installation mechanism is accomplished with a front-to-rear motion which sequentially provides a power connection to the microprocessor and displaces it in a vertical motion. This vertical motion registers and mates the microprocessor with the assembly. The microprocessor is preloaded in its final latched position to restrain it from shock and vibration events while supporting the assembly in a fixed and stable position.

36 Claims, 5 Drawing Sheets

MULTI-AXIS MICROPROCESS OR DOCKING MECHANISM

BACKGROUND OF THE INVENTION

1. Technical Field

This invention relates in general to field servicing microprocessors and in particular to a mechanism for hot plug docking a microprocessor.

2. Background Art

Modern computers often utilize multiple microprocessors to share the processing demand in order to achieve high levels of performance. At the same time, business-critical applications demand a high level of availability. These competing aspects create a requirement for field serviceability and upgradeability that can be performed without substantially disrupting the performance capability of the computer system. Specifically, the "hot plug" replacement or installation of individual microprocessors while the computer system remains operational is a requirement. Further, it is desirable that any "hot plug" replacement or installation of a microprocessor be accomplished with relative ease and with minimal disassembly of the computer system.

The service aspects of rack mounted drawer systems can be problematic due to limited accessibility. Accessibility is usually limited to the front or the rear, as opposed to the front, rear, side and top access associated with most non-rack floor standing computer systems. Rack drawers are sometimes displaced to the front or rear within a rack to provide service access from the top. However, this is undesirable due to the potential problems associated with cable management as well as the level of disassembly required to displace the drawer. Service-in-place, in which the rack drawer is not displaced but rather serviced through front and/or rear access only, is therefore the preferred approach.

SUMMARY OF THE INVENTION

A mechanism has a subassembly that contains a microprocessor. The mechanism allows the microprocessor to be easily installed through frontal or rear access into a rack drawer and subsequently docked into a receiving socket. The docking mechanism is multi-axis in that installation of the subassembly occurs along a single axis, but docking of the microprocessor occurs along an axis that is normal to the installation axis. Actuation of the installation mechanism is accomplished with a front-to-rear motion which sequentially provides a power connection to the microprocessor and displaces it in a vertical motion. This vertical motion registers and mates the microprocessor with the socket. The microprocessor is preloaded in its final latched position to restrain it from shock and vibration events while supporting the assembly in a fixed and stable position.

BEST MODE FOR CARRYING OUT THE INVENTION

Figure 1:
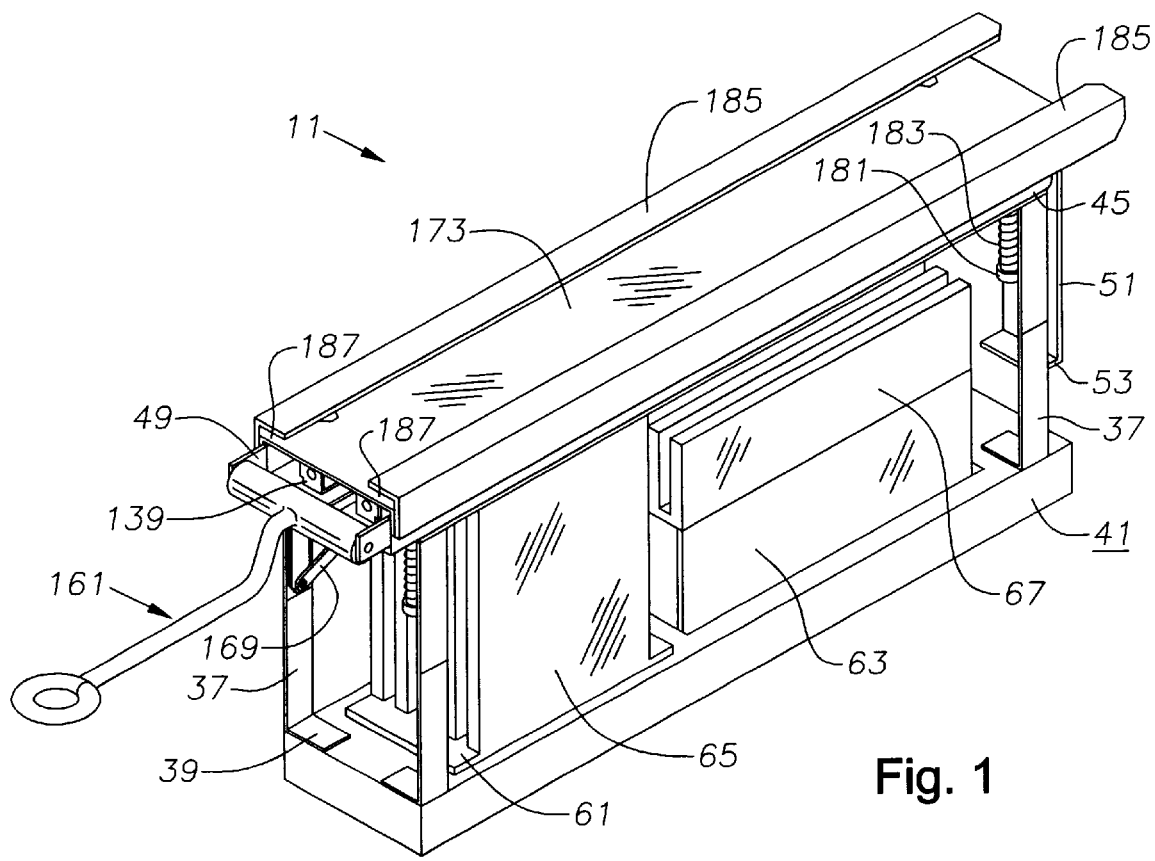
FIG. 1 is a front isometric view of a docking mechanism constructed in accordance with the invention.
Figure 3:
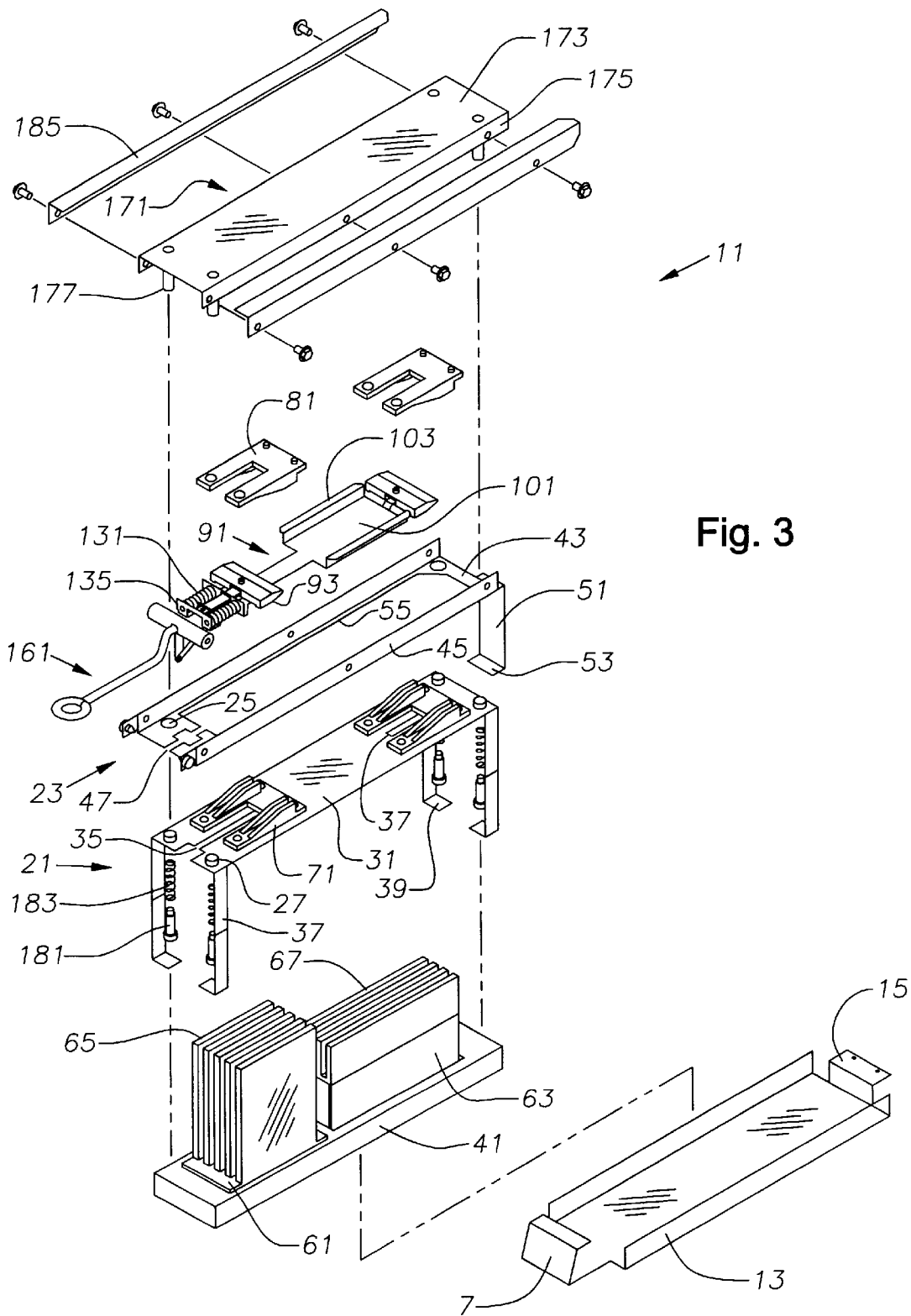
FIG. 3 is an exploded, front isometric view of the mechanism of FIG. 1.

Referring to FIGS. 1 and 3, a docking mechanism module or assembly 11 for installing/removing a microprocessor subassembly relative to a receiving socket is shown. In the disclosed embodiment, the dockable assembly 11 is installed into a receptacle in a rack drawer (not shown), but the concept is not limited to rack drawer applications. Under such circumstances, assembly 11 is designed to be used as a field replaceable unit (FRU) which may be upgraded or replaced as a single detachable entity.

Figure 6:
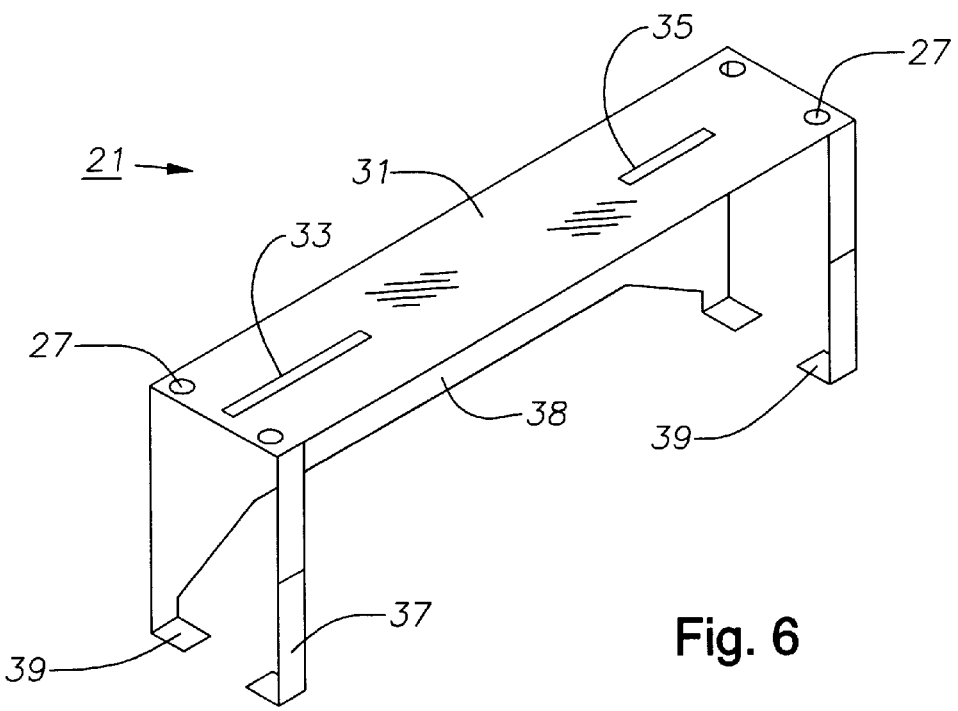
FIG. 6 is a front isometric view of a lower chassis for the mechanism of FIG. 1.
Figure 7:
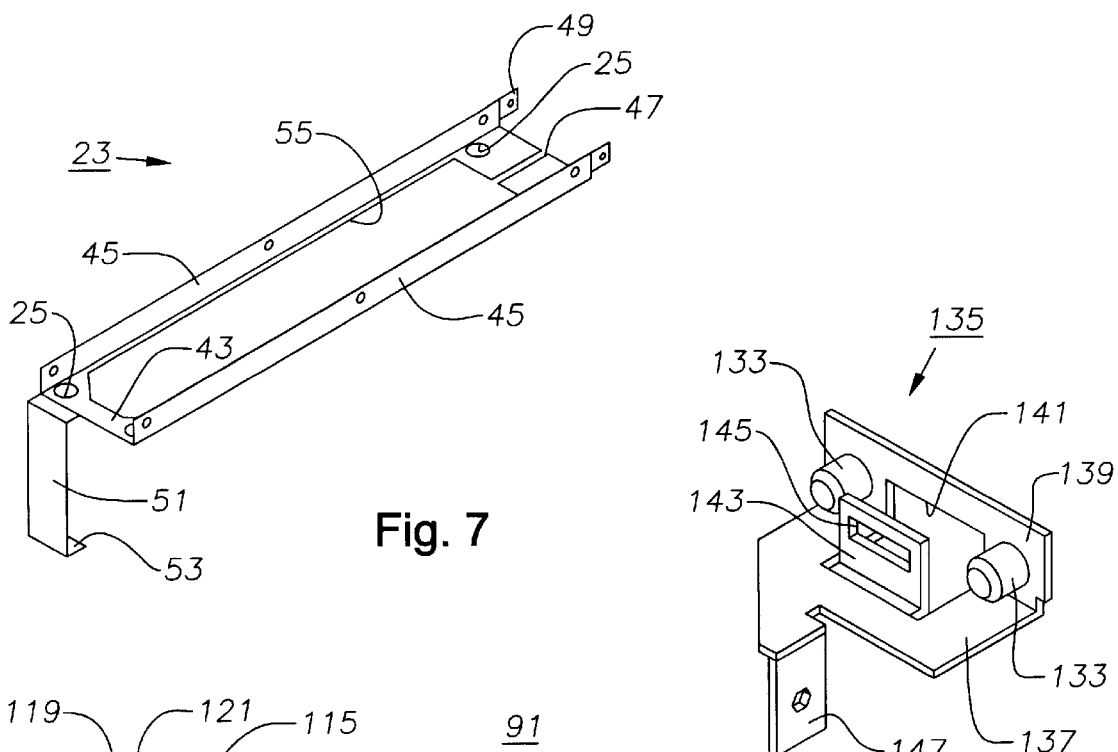
FIG. 7 is a rear isometric view of a center chassis for the mechanism of FIG. 1.

Assembly 11 has two main support structures for supporting its various components: lower chassis 21 (FIG. 6) and center chassis 23 (FIG. 7). As shown in FIG. 3, center chassis 23 mounts on top of lower chassis 21 and aligns with it at their respective set of horizontally-disposed holes 25, 27. Lower chassis 21 has an elongated, horizontally planar body 31 with a pair of longitudinal slots 33, 35 which are aligned but spaced apart from each other. Holes 27 are located near the four corners of body 31. As shown on the right side of FIG. 6, a flat, brace-like leg 37 depends vertically downward from each of the corners of body 31. Legs 37 are equal in length and parallel to one another. In the preferred embodiment (the right side of FIG. 6), a side panel 38 is used is in place of each pair of laterally adjacent legs 37. Sides panels 38 extend continuously along the longitudinal length of chassis 21. Each leg 37 or panel 38 has a short, inward-protruding tab 39 on its lower end which forms "feet" with which lower chassis 21 will mount to a rectangular processor carrier 41 (FIGS. 1 and 3). The tabs 39 at the lower ends of lower chassis 21 mount to processor carrier 41. Carrier 41 may be formed from reinforced plastic, but could be a metal die casting or other fabrication with adequate stiffness to support the weight of the mounted devices, and with adequate stiffness to support the docking forces.

Figure 2:
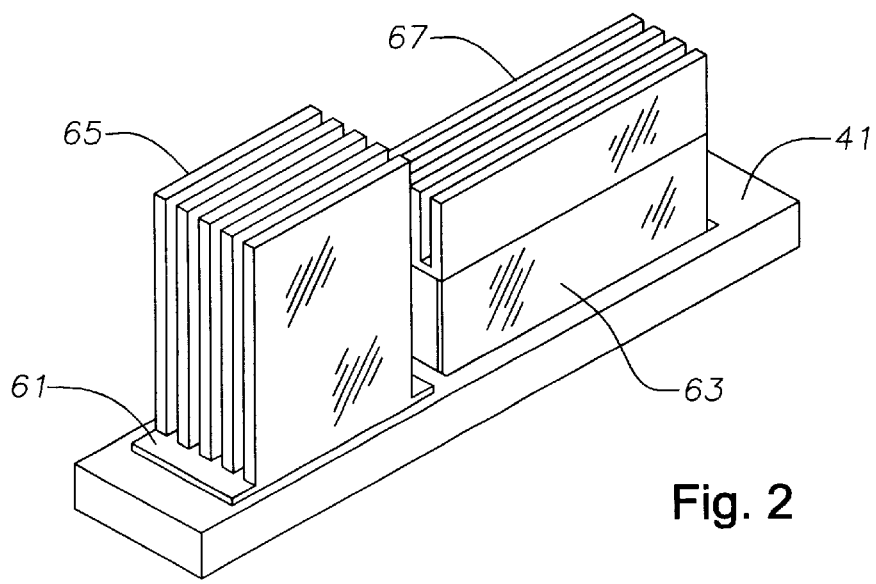
FIG. 2 is a front isometric view of an electrical component base used by the mechanism of FIG. 1.

As shown in FIG. 2, carrier 41 is adapted to carry and securely restrain a microprocessor 61 and a power module 63, which each have a heatsink 65, 67, respectively. Heatsinks 65, 67 may be permanently mounted on carrier 41 for coupling to their respective components. Although the disclosed embodiment of carrier 41 shows power module 63 and heatsinks 65, 67, these are not requirements. If module 63 and/or heatsinks 65, 67 were not a part of carrier 41, the overall length and/or height of assembly 11 would be reduced. The contacts or pins of microprocessor 61 and power module 63 (not shown) extend through openings in carrier 41 such that they are exposed on the lower side of carrier 41.

Center chassis 23 comprises a generally horizontal frame 43 with upward-turned flanges 45 which extend along the sides of its entire length, parallel to one another. Holes 25 are located near the four corners of frame 43. A longitudinal slot 47 is located in the forward end of frame 43 between the front two holes 25. Center chassis 23 also has a pair of vertically-oriented tabs 49 which protrude forward from the front ends of side flanges 45. A vertically downward-depending support leg 51 extends from the right rear corner of frame 43. Leg 51 is perpendicular to frame 43 and flanges 45, and has a short, inward-protruding flange 53 on its lower end. A large, generally rectangular hole 55 extends through frame 43. Slot 47 is contiguous with hole 55.

Figure 4:
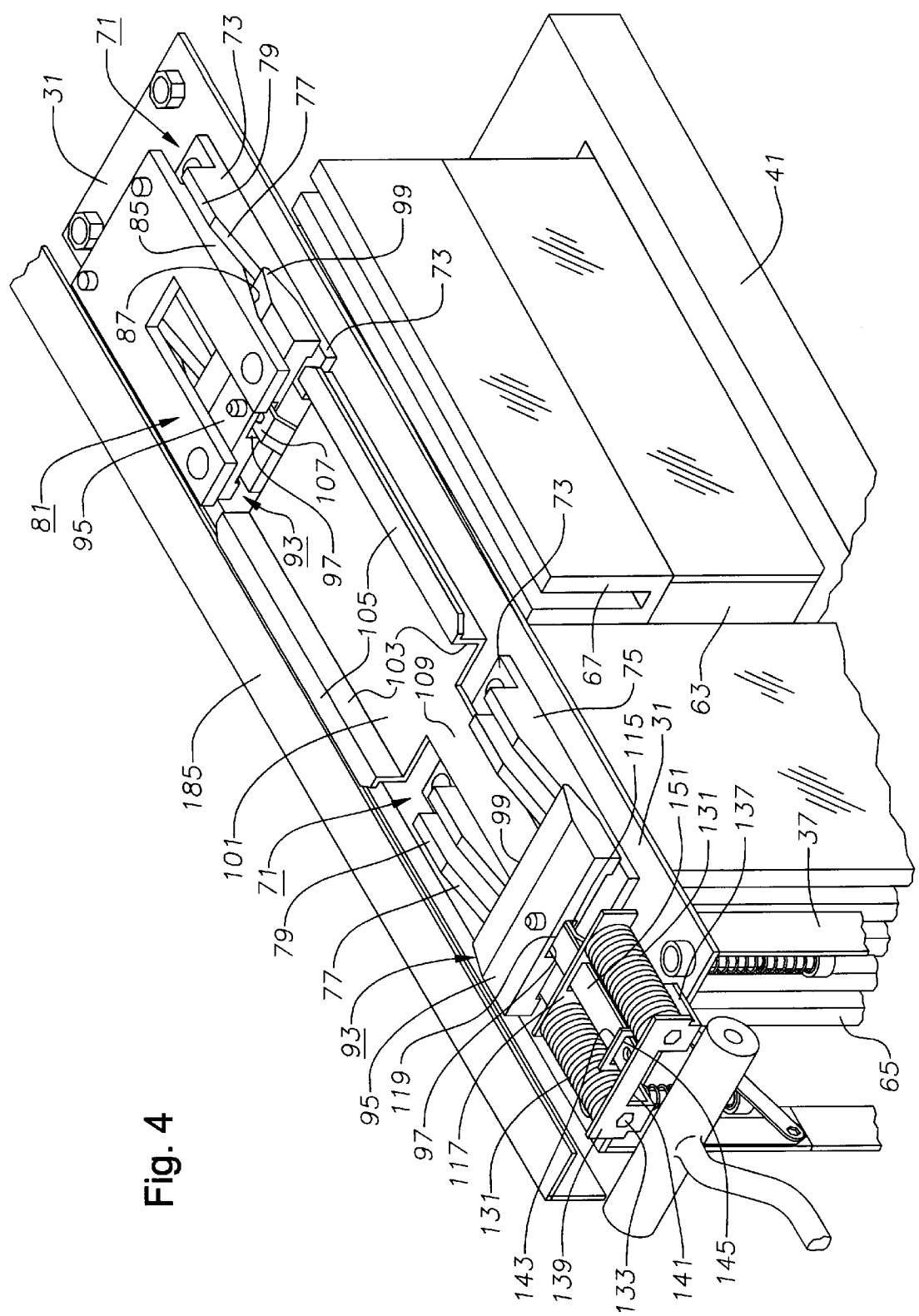
FIG. 4 is an enlarged, front isometric view of the top of the mechanism of FIG. 1 with an upper portion removed.

As shown in FIGS. 3 and 4, a pair of lower wedge plates 71 are fastened to the upper surface of body 31 on lower chassis 21. Each wedge plate 71 comprises a horizontally planar base 73 having four ramp-like members 75 which are parallel to one another. Each ramp 75 has an inclined portion 77 which tapers from back to front, and a level portion 79 at its rearward end. Each of the inclined and level portions 77, 79 are aligned with one another on each wedge plate 71. Each lower wedge plate 71 has an identical, mating upper wedge plate 81 located directly above it and mounted to body 31. Upper wedge plates 81 are inverted relative to lower wedge plates 71 such that their respective ramps 85, 75 mesh or interleave with one another as shown on the right side of FIG. 4. The interleaving of wedge plates 71, 81 creates an increased range of vertical motion for assembly 11.

Figure 9:
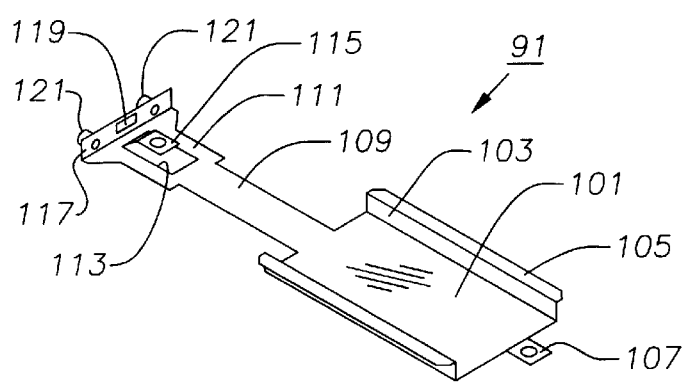
FIG. 9 is a rear isometric view of a yoke carrier for the mechanism of FIG. 1.

Referring to FIGS. 4 and 9, a yoke 91 is provided for driving a pair of actuation wedges 93 between and relative to wedge plates 71, 81. Each actuation wedge 93 has a rectangular body 95 with a square central opening 97 on a forward end. The rearward ends of actuation wedges 93 taper symmetrically on both sides to a flat edge 99. Flat edges 99 and their adjoining tapered surfaces are designed to slidably engage the inclined portions 77, 87 of wedge plates 71, 81. Yoke 91 enable actuation wedges 93 to freely align with wedge plates 71, 81.

As shown in FIG. 9, yoke 91 has a substantially planar, horizontally-disposed body 101, with a short, upturned flange 103 along each side edge. Each flange 103 has a short, outward-extending lip 105 which is parallel to body 101. Lips 105 are provided for slidably engaging a pair of flanges 175 on a base or top cover 171 which will be described below. A small rectangular tab 107 protrudes from the center of the rearward edge of body 101. Tab 107 is elevated slightly above and is parallel to body 101. A flat neck 109 extends forward from the forward edge of body 101. Neck 109 is coplanar with and approximately the same length as body 101. Neck has a generally trapezoidal head 111 on its forward end which has a central square hole 113. A tab 115 extends into and is elevated slightly above hole 113, in the same manner that tab 107 is relative to body 101. An upward-turned flange 117 extends across the forward edge of head 111 and is perpendicular thereto. Flange 117 has a central, rectangular hole 119 and a cylindrical bullet 121 symmetrically spaced-apart on either side of hole 119. Bullets 121 extend forward from the front surface of flange 117. Note that tabs 115, 107 extend into holes 97 (FIG. 4) in front and rear actuation wedges 93, respectively. When assembled, neck 109 rests on and slidably engages the upper surface of base 73 on forward lower wedge plate 71, and body 101 is located between the lower wedge plates 71. Hereinafter, yoke 91, wedges 93, wedge plates 71, 81 may be referred to as "the running gear."

Figure 8:
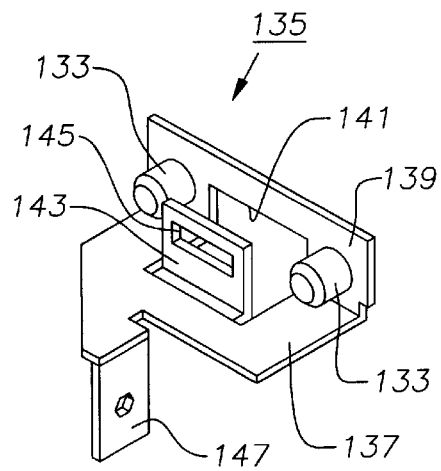
FIG. 8 is a front isometric view of a pusher channel for the mechanism of FIG. 1.

The rearward end of a compression spring 131 is concentric with and mounted to each bullet 121. The forward ends of springs 131 are mounted to bullets 133 on a pusher channel 135 (FIGS. 4 and 8). Springs 131 allow compensation for tolerances in the overall assembly, and, thus, allow actuation wedges 93 to be force driven, not displacement driven. Pusher channel 135 has a horizontal, trapezoidal base 137, an upturned rectangular flange 139 (from which bullets 133 extend rearward) and a contiguous, central rectangular opening 141 therebetween. Channel 135 also has a perpendicular tab 143 located rearward of flange 139. Tab 143 has a central rectangular hole 145. An elongated, flat drive tab 147 depends vertically downward from the center to of the rearward end of channel 135. Drive tab 147 is perpendicular to both body 137 and flange 139. When channel 135 is mounted in assembly 11, drive tab 147 extends downward through slot 33, 47 in chassis 21, 23, respectively. A flat bar 151 (FIG. 4) extends horizontally between and through holes 119, 145 and opening 141. The rearward end of bar 151 is fastened to tab 115 and opening 97 in front actuation wedge 93. The forward end of bar 151 is not attached, but is slidable relative to tabs 115 and 143.

Figure 5:
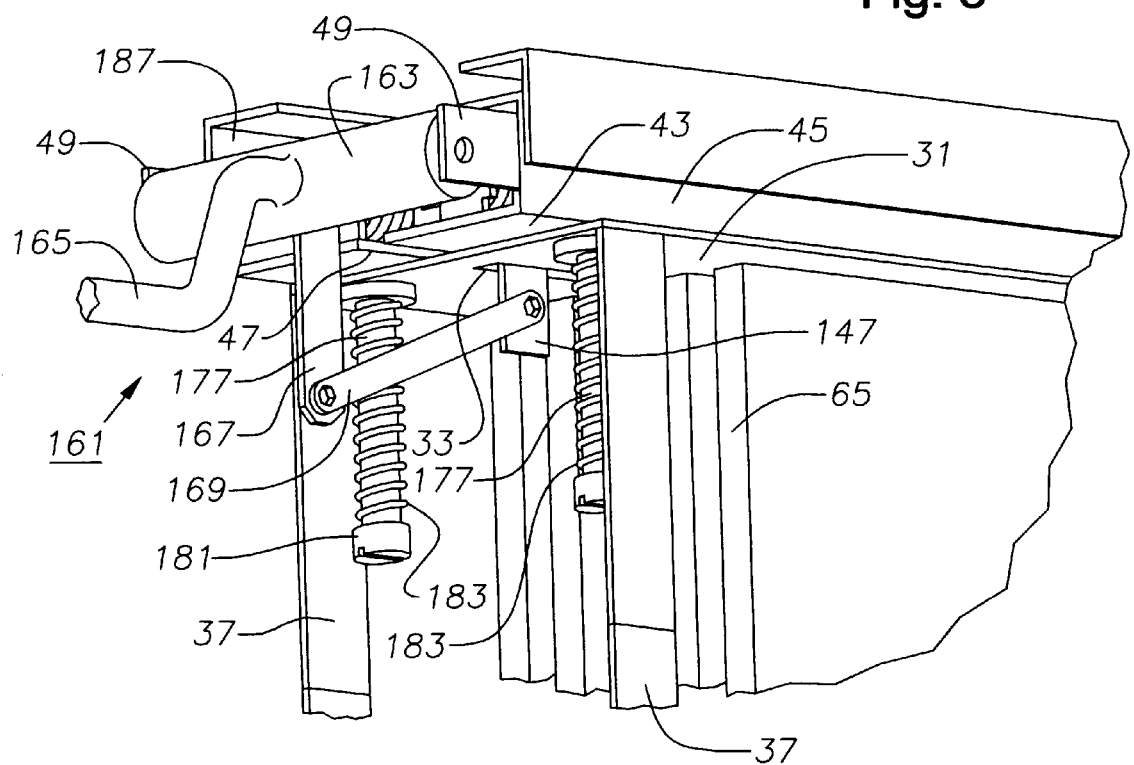
FIG. 5 is an enlarged, lower, front isometric view of the mechanism of FIG. 1.

Referring now to FIG. 5, an actuation mechanism 161 is attached to the front end of assembly 11. Mechanism 161 comprises a cylindrical axle 163 which is pivotally joined between tabs 49 of center chassis 23. Axle 163 has an elongated handle 165 which extends forward from its rearward side, and a short pivot arm 167 which extends downward from its lower side. The lower end of pivot arm 167 is pivotally joined to the forward end of a linkage 169. Linkage 169 extends diagonally upward and rearward from pivot arm 167 to the lower end of drive tab 147, where it is pivotally mounted thereto.

Figure 10:
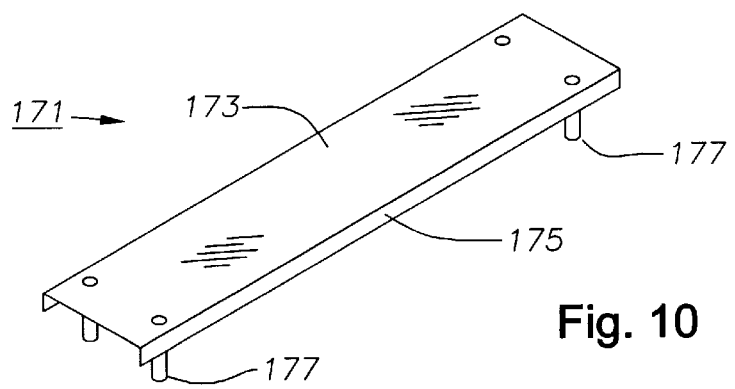
FIG. 10 is an isometric view of a top cover for the mechanism of FIG. 1.

As shown in FIGS. 1, 5 and 10, assembly 11 has a generally rectangular top cover 171 which forms its upper end. Cover 171 has a horizontally planar body 173 and a pair of downward-depending side flanges 175 extending along each of its sides. Cover 171 also has four hollow tubes 177 which extend downward from the lower surface of body 173. Each tube 177 is located near one of the four corners of cover 171 and contains internal threads. The lower ends of tubes 177 are located below flanges 175.

Referring now to FIGS. 1, 4 and 5, when cover 171 is placed on top of assembly 11, tubes 177 extend unimpeded through holes 25, 27 in chassis 23, 21, respectively such that a substantial portion of their length is located below the lower surface of body 31 (FIG. 5). A shouldered bolt 181 is threaded into each tube 177 and captures a vertically-oriented compression spring 183 between its head and the lower surface of body 31. Springs 183 are selected to create an upward-biased force against body 31 to sandwich wedges 71, 81, 93 between chassis 21 and cover 171. Springs 183 are sufficiently preloaded to hold the carrier assembly in the disengaged position when the running gear is disengaged. Springs 183 also allow compensation for tolerances in the overall assembly. Assembly 11 has a pair of guide rails 185 (FIGS. 1 and 3–5) which extend longitudinally along the upper edges of cover 171. Guide rails 185 are L-shaped in cross-section and approximately equal in length to top cover 171. Guide rails 185 are rigidly mounted to top cover 171 such that a small clearance 187 exists between the upper surface of top cover 171 and the lower surfaces of guide rails 185.

Assembly 11 also has a detachable protective cover 13 (FIG. 3) which attaches to its lower surface. Cover 13 protects the fragile pins or other socketing interface to the microprocessor 61 during shipping or handling. Cover 13 is attached by fastening its rearward end 15 to the rear of carrier 41 and clipping its forward end 17 to the front of carrier 41.

In operation, protective cover 13 is removed from assembly 11 prior to installation into a receptacle in a rack drawer (not shown) or other housing. Installation is accomplished by positioning the top of assembly 11 such that clearances 187 align with and slidably engage a mating feature on the rack drawer. Assembly 11 may be modified to be inserted into the rack drawer in either a forward or rearward direction until it is longitudinally aligned and engages a fixed stop. If inserted in the rearward direction, leg 51 may be used as a backstop against the receptacle to ensure proper positioning of assembly 11.

Microprocessor 61 and power module 63 are vertically docked into mating sockets in the rack drawer by the following steps. Handle 165 is rotated approximately 90 degrees counterclockwise from its substantially horizontal orientation (FIGS. 1 and 5) to a substantially vertical orientation (not shown) such that handle is pointed downward. With this motion, pivot arm 167 and linkage 169 move rearward causing drive tab 147 (FIG. 5) to translate rearward.

Pusher channel 135 moves rearward with drive tab 147, thereby compressing springs 131 against flange 117 of yoke 91. Springs 131 exert sufficient force on yoke 91 to slide it and, thus, actuation wedges 83 rearward. As wedges 83 are forced between wedge plates 71, 81, lower wedge plates 71 are forced downward away from upper wedge plates 81 since the vertical movement of upper wedge plates 81 is restrained by top plate 171 which is fixed from vertical motion in the rack drawer. Thus, upper wedge plates 81 are stationary, and lower wedge plates 71 and wedges 93 translate vertically. The downward movement of lower wedge plates 71 also forces lower chassis 21 and its legs 37 downward. Since legs 37 are rigidly joined to carrier 41 at tabs 39, carrier 41 and, thus, microprocessor 61 and power module 63 are also forced downward into mating engagement with the sockets in the rack drawer. Legs 37 provide a structural path for the transmission of docking forces from the docking running gear above.

Horizontal springs 131 serve several functions including adding compliance between the pins of components 61, 63 and their sockets, and rotating handle 163 to a fixed stop, latched position even after components 61, 63 are seated. Vertical springs 183 serve to return the components 61, 63 to the fully disengaged position when handle 165 is moved to its horizontal open position. Installation is completed by actuating an engagement lever on microprocessor zero insertion force (ZIF) socket body (not shown) in the receptacle.

The area of unconstrained planar against which the carrier 41 docks is minimal, providing a high degree of stiffness against which a single dockable assembly 11 can be installed. Maximum structural integrity is achieved, however, when dockable assemblies 11 are installed in opposing pairs (e.g. an assembly 11 which docks as it moves downward situated above another assembly 11 which docks as it moves upward). In this situation, the preload forces acting against each assembly 11 counteract each other. The space between the two assemblies 11 is filled with rigid dockable subassemblies (not shown), and any spatial clearances in the stack are accommodated by the wedge subassemblies. From a ruggedness and durability standpoint, it is critical that once the dockable assembly(s) is installed, that the clearances absorbed by the wedge subassemblies must not be allowed to be reintroduced into the stack. This is accomplished by enforcing a friction lock in the wedge subassemblies. In other words, the combination of wedge attack angle and the coefficient of friction between the mating wedge parts is controlled such that no developed force acting between the wedge plates 71, 81 can expel the actuation wedges 93. This is termed "friction lock" and guarantees that tolerances absorbed in the assembly 11 remain absorbed. Additionally, any newly introduced clearances such as might occur in vibration and/or shock environments are also absorbed by the wedge subassemblies since the actuation wedges 93 are spring-loaded.

Removal of assembly 61 is accomplished by first releasing the engagement lever and then unlatching handle 163. Handle 163 is rotated clockwise or upward to its original position so that actuation wedges 93 slide out of wedge plates 71, 81. The upward bias of springs 83 forces or returns chassis 21 to its upward position, thereby extracting the components 61, 63 out of their sockets. The entire assembly 61 can then be pulled out of the receptacle in the rack drawer along the guide rails 185 until it is totally removed from the drawer.

The invention has several advantages. The docking mechanism allows service-in-place of rack drawers through frontal or rear access and, thus, supports microprocessor field replacement, upgrade and expansion. The multi-axis function docks microprocessor subassemblies into a perpendicular planar and is readily applicable to vertical or horizontal configurations. The subassembly installation is simple, user friendly and requires minimal disassembly of the rack drawer. The invention supports dual mode operation as the docking mechanism can be applied to the installation of subassemblies into the planar in either direction. Power modules and/or heatsinks are easily integrated into the dockable subassembly and power to the microprocessor is regulated through a docking power connector. The mechanism provides microprocessor alignment to the receiving socket. A unique interleaved wedge loading mechanism provides high mechanical advantages within a small volume to preload the microprocessor subassembly into the receiving socket to provide shock and vibration protection. The wedge loading mechanism has a friction-locking aspect that assures retention of preload in vibration environments. Installed microprocessor module pairs (top and bottom) provide structural continuity between the microprocessor planar and the structural support elements at the top and bottom of the rack drawer. This minimizes the structural reinforcement that must be applied to the planar which is difficult to achieve due to space constraints.

While the invention has been shown or described in only some of its forms, it should be apparent to those skilled in the art that it is not so limited, but is susceptible to various changes without departing from the scope of the invention.

We claim:

1. A module for insertion into a receptacle of an electrical assembly, the module comprising:

a carrier having a first end, a second end, a longitudinal axis and a transverse axis which extends from the first end to the second end and which is perpendicular to the longitudinal axis;

an electrical component mounted to the first end of the carrier such that the component has an exposed portion for engaging the electrical assembly, the component having a disengaged position wherein the component is adapted to be disengaged from the electrical assembly, and an engaged position wherein the component is adapted to be engaged with the electrical assembly;

a base mounted to the second end of the carrier such that the carrier is movable relative to the base along the transverse axis;

a manually movable actuator located between the base and the second end of the carrier and having an independent mechanism which is movable relative to the chassis and the base, the actuator being movable between a first position and a second position; and wherein the module is adapted to insert into the receptacle along the longitudinal axis such that it longitudinally aligns the electrical component and, when the actuator is moved from the first position to the second position, the independent mechanism of the actuator converts the motion of the actuator into motion along the transverse axis to move the carrier and the component from the disengaged position to the engaged position.

2. The module of claim 1 wherein the second end of the carrier comprises a chassis with planar body which is perpendicular to the transverse axis, and the first end of the chassis comprises a plurality of legs which depend from the body toward the component, such that the carrier is mounted to the legs opposite the body.

3. The module of claim 1 wherein the independent mechanism of the actuator comprises a yoke connected to the actuator, and a stationary member, the yoke being slidably coupled to the stationary member and movable along the longitudinal axis; and wherein when the actuator moves to the second position, the yoke moves toward the stationary member such that the carrier moves the component to the engaged position, and when the actuator returns to the first position, the yoke moves away from the stationary member such that the carrier moves the component to the disengaged position.

4. The module of claim 3 wherein the stationary member comprises a wedge plate which abuts the base and has an inclined surface, and the yoke abuts the second end of the carrier and has an actuation wedge with an inclined surface which slidingly engages the inclined surface of the wedge plate.

5. The module of claim 4, further comprising a second wedge plate mounted to the second end of the carrier and inverted relative to said wedge plate, the second wedge plate also having an inclined surface which is adjacent but inverted relative to the inclined surface of said wedge plate, and wherein the actuation wedge slidingly engages the inclined surfaces of the wedge plates simultaneously to move the carrier and component between the disengaged and engaged positions.

6. The module of claim 4 wherein the yoke has a pair of actuation wedges, each of which moves between a pair of wedge plates that are inverted relative to one another.

7. The module of claim 1 wherein the actuation wedges are retained in the wedge plates with a friction lock.

8. The module of claim 3, further comprising a bracket connected to the actuator and compliantly coupled to the yoke for moving the yoke relative to the carrier.

9. The module of claim 8, further comprising a bias member located between the bracket and the yoke for biasing the actuator to the first position.

10. The module of claim 1 wherein the actuator comprises a lever having a pivot end which is pivotally mounted to the carrier and a pusher end which is connected to the independent mechanism.

11. The module of claim 1, further comprising a bias member mounted between the base and the carrier for biasing the carrier and component to the disengaged position.

12. The module of claim 1, further comprising a carrier cover detachably coupled to the first end of the carrier for protecting the exposed portion of the electrical connector.

13. A module for insertion into a receptacle of an electrical assembly, the module comprising:

a chassis having a first end, a second end, a longitudinal axis and a transverse axis which extends from the first end to the second end and which is perpendicular to the longitudinal axis;

an electrical component mounted to the first end of the chassis such that the component has an exposed portion for engaging the electrical assembly, the component having a disengaged position wherein the component is adapted to be disengaged from the electrical assembly, and an engaged position wherein the component is adapted to be engaged with the electrical assembly;

a base mounted to the second end of the chassis such that the chassis is movable relative to the base along the transverse axis;

a manually movable actuator located between the base and the second end of the chassis, the actuator being movable between a first position and a second position;

a wedge plate mounted to the second end of the chassis, the wedge plate being adjacent to and abutting the base and having an inclined surface;

a yoke located between the base and the second end of the chassis, the yoke being connected to the actuator and slidably coupled to the wedge plate such that it is movable along the longitudinal axis relative to the chassis and the base;

an actuation wedge mounted to the yoke and having an inclined surface which slidingly engages the inclined surface of the wedge plate; and wherein the module is adapted to insert into the receptacle along the longitudinal axis such that it longitudinally aligns the electrical component with the electrical socket and, when the actuator moves from the first position to the second position, the yoke moves the actuation wedge into further engagement with the wedge plate such that the chassis moves the component along the transverse axis to the engaged position, and when the actuator returns to the first position, the yoke moves the actuation wedge into lesser engagement with the wedge plate such that the chassis moves the component in the opposite direction along the transverse axis to the disengaged position.

14. The module of claim 13 wherein the actuation wedge engages the wedge plate with a friction lock.

15. The module of claim 13 wherein the second end of the chassis comprises a planar body which is perpendicular to the transverse axis and a plurality of legs protruding from the body to the first end, and the first end of the chassis comprises a carrier mounted to the legs, such that the component is mounted to the carrier opposite the body.

16. The module of clam 15, further comprising an opening in the body through which a bracket of the actuator extends, the independent mechanism of the actuator being connected to the bracket.

17. The module of clam 13, further comprising a guide bearing mounted to the module for facilitating alignment with the receptacle of the electrical assembly.

18. The module of claim 13, further comprising a second wedge plate mounted to the second end of the chassis and inverted relative to said wedge plate, the second wedge plate also having an inclined surface which is adjacent but inverted relative to the inclined surface of said wedge plate, and wherein the actuation wedge slidingly engages the inclined surfaces of the wedge plates simultaneously to move the chassis and component between the disengaged and engaged positions.

19. The module of claim 13 wherein the yoke has a pair of actuation wedges, each of which moves between a pair of wedge plates that are inverted relative to one another.

20. The module of claim 13, further comprising a bracket connected to the actuator and compliantly coupled to the yoke for moving the yoke relative to the chassis.

21. The module of claim 20, further comprising a bias member located between the bracket and the yoke for biasing the actuator to the first position.

22. The module of claim 21 wherein the bias member comprises a spring having an axis which is parallel to the longitudinal axis.

23. The module of claim 13 wherein the actuator comprises a lever having a pivot end which is pivotally mounted to the chassis and a pusher end which is connected to the yoke.

24. The module of claim 23 wherein the lever has an elongated handle extending from the pivot end which is manually operable between the first and second positions, a pivot arm extending from the pivot end and spaced apart from the handle, and a linkage joining the pivot arm and the yoke.

25. The module of claim 13, further comprising a bias member mounted between the base and the chassis for biasing the chassis and component to the disengaged position.

26. The module of claim 25 wherein the bias member comprises a spring having an axis which is parallel to the transverse axis.

27. The module of claim 25 wherein the chassis has four corners and wherein the bias member comprises a spring located adjacent to each of the corners, each of the springs being captured by a fastener between the base and the chassis.

28. The module of claim 27 wherein the fasteners are mounted to and extend from the base through the chassis such that the springs are captured on an opposite side of the chassis relative to the base.

29. The module of claim 13, further comprising a chassis cover detachably coupled to the first end of the chassis for protecting the exposed portion of the electrical connector.

30. A method for docking a module into a receptacle of an electrical assembly, the method comprising:

(a) providing a carrier with a first end, a second end, an actuator, a longitudinal axis and a transverse axis which extends from the first end to the second end and which is perpendicular to the longitudinal axis;

(b) mounting an electrical component to the first end of the carrier, the component having an engaged position wherein it is engaged with the electrical assembly, and a disengaged position wherein it is disengaged with the electrical assembly;

(c) mounting a base to the second end of the carrier such that the carrier is movable relative to the base along the transverse axis;

(d) inserting the module into the receptacle along the longitudinal axis such that it longitudinally aligns the electrical component with the electrical assembly;

(e) moving the actuator from a first position to a second position such that the carrier and the component move along the transverse axis from the disengaged position to the engaged position.

31. The method of claim 30, further comprising the step of moving the actuator from the second position to the first position such that the carrier and the component move along the transverse axis from the engaged position to the disengaged position.

32. The method of claim 30 wherein, after the actuator is returned to the second position, the module is removed from the receptacle along the longitudinal axis.

33. The method of claim 30, further comprising the step of biasing the actuator to the first position.

34. The method of claim 30 wherein step (e) comprises pivoting the actuator relative to the carrier.

35. The method of claim 30 wherein step (b) comprises biasing the carrier and component to the disengaged position.

36. The method of claim 30 wherein step (e) further comprises frictionally locking the actuator at the second position to prevent it from inadvertently returning to the first position.

* * * * *